United States Patent
Sandin et al.

(10) Patent No.: US 10,064,260 B2
(45) Date of Patent: Aug. 28, 2018

(54) GROUND SYSTEM FOR HIGH VOLTAGE SEMICONDUCTOR VALVE

(71) Applicant: ABB TECHNOLOGY LTD, Zürich (CH)

(72) Inventors: Björn Sandin, Ludvika (SE); Christer Sjöberg, Ludvika (SE); Erik Doré, Ludvika (SE); Johannes Gran Hirvioja, Ludvika (SE)

(73) Assignee: ABB SCHWEIZ AG, Baden (CH)

( * ) Notice: Subject to any disclaimer, the term of this patent is extended or adjusted under 35 U.S.C. 154(b) by 289 days.

(21) Appl. No.: 15/034,268

(22) PCT Filed: Nov. 5, 2013

(86) PCT No.: PCT/EP2013/073017
§ 371 (c)(1),
(2) Date: May 4, 2016

(87) PCT Pub. No.: WO2015/067296
PCT Pub. Date: May 14, 2015

(65) Prior Publication Data
US 2016/0278192 A1    Sep. 22, 2016

(51) Int. Cl.
| | | |
|---|---|---|
| H02H 9/00 | (2006.01) | |
| H05F 3/02 | (2006.01) | |
| H01L 23/00 | (2006.01) | |
| H02H 9/02 | (2006.01) | |

(52) U.S. Cl.
CPC ............... *H05F 3/02* (2013.01); *H01L 23/00* (2013.01); *H02H 9/02* (2013.01); *H01L 2924/0002* (2013.01)

(58) Field of Classification Search
CPC .......................................................... H05F 3/02
See application file for complete search history.

(56) References Cited

U.S. PATENT DOCUMENTS

| | | | | |
|---|---|---|---|---|
| 4,564,250 A | * | 1/1986 | Klein | ............. H05K 7/1409 361/784 |
| 4,631,656 A | | 12/1986 | Olsson | |
| 5,398,156 A | * | 3/1995 | Steffes | ............. G06F 1/182 29/831 |
| 5,954,524 A | * | 9/1999 | Wingert | ............. H01R 4/66 174/359 |
| 8,297,450 B2 | * | 10/2012 | Zavidniak | ............. H05K 7/183 211/13.1 |

(Continued)

FOREIGN PATENT DOCUMENTS

| | | |
|---|---|---|
| CN | 201883727 U | 6/2011 |
| CN | 202394787 U | 8/2012 |

(Continued)

*Primary Examiner* — Stephen W Jackson
(74) *Attorney, Agent, or Firm* — Birch, Stewart, Kolasch & Birch, LLP

(57) ABSTRACT

A high voltage valve arrangement includes a high voltage valve unit; an external electric shield structure arranged at least partially around the high voltage modular valve unit and a grounding system. The grounding system includes a grounding system configured to be remotely extended from a retracted position to an extended position, whereby the extendable grounding device establishes electric connection with the external shield structure when it is extended from the retracted position.

20 Claims, 3 Drawing Sheets

(56) References Cited

U.S. PATENT DOCUMENTS

2016/0244255 A1* 8/2016 Chynoweth ............ B65D 90/46

FOREIGN PATENT DOCUMENTS

| CN | 202474665 U | 10/2012 |
| EP | 0 317 476 A2 | 5/1989 |
| WO | WO 2007/149015 A1 | 12/2007 |
| WO | WO 2010/004338 A2 | 1/2010 |
| WO | WO 2010/094338 A1 | 8/2010 |
| WO | WO 2013/075754 A1 | 5/2013 |

* cited by examiner

GROUND SYSTEM FOR HIGH VOLTAGE SEMICONDUCTOR VALVE

TECHNICAL FIELD

The invention relates to a grounding system for a high voltage semiconductor valve.

BACKGROUND

In valve halls where high voltage semiconductor valves may be arranged hanging from the ceiling; regular maintenance and/or alteration may be required. When the valve is energized no personnel should be in the valve hall. For some purposes, such as maintenance, the valves need to be deenergized to allow personnel to enter the valve hall. In case personnel have to safely enter the valve hall, the valves need to be connected to ground to avoid electric discharges from the valves, such as surge current strokes or corona discharges originating from residual capacitor charges or static charge in the insulating material, which may harm the personnel present in the valve hall. So called corona shields are used in existing valves to lower the electrical fields in order to minimize the risk for partial discharge and/or flashover. The shields are installed around the outer surfaces of the valve. Discharges and spontaneous discharges may also occur when the valves are deenergized. Corona discharges are self sustainable partial discharges close to the highly stressed valve. The corona discharge depends among others on humidity and density in the atmosphere, voltage level and distance to nearby objects.

It is known to provide grounding of the valves when the valve hall is opened and accessible for maintenance personnel and people in general, thus when the valves are deenergized. The grounding is used to ensure that residual charges in the system or arrangement, for example from the capacitors, are discharged. For such grounding purposes an operator has to enter the valve hall and manually install a grounding contact. Such a grounding contact must first be moved to the right place, then connected to a plug or socket in the valve hall floor and then extended to establish electric contact with the valve. These steps have to be taken by an operator who is close to the actual grounding contact or at least in the valve hall, since the grounding contact has to be moved in the right position, connected to the plug and extended to electrically connect to the valve. Remaining charges in the capacitors or spontaneous discharges may occur during these steps, which may harm the operator. In addition, as always when human work is involved, the manual steps during such a grounding operation raise potential risk of failures or mistakes. Also, there are a plurality of valves in a valve hall. Further, the above described manual steps are time consuming and thus costly.

SUMMARY

It is thus an object of the present invention to provide an improved grounding system for a high voltage semiconductor valve.

This object is attained by a high voltage valve arrangement comprising a high voltage valve unit, an external electric shield structure arranged at least partially around the high voltage valve unit and a grounding system. The grounding system comprises an extendable grounding device configured to be extended from a remote location so that it may move from a retracted position into an extended position, wherein the extendable grounding device establishes electric connection with the external electric shield structure when it is extended from the retracted position.

The extendable grounding mechanism may be automatically extendable from a remote location. It may thus be remotely controlled. The remote location may even be outside the valve hall.

Advantageously, the high voltage valve arrangement may comprise a plurality of guide elements, which are electrically connected to the electric shield structure, whereby the extendable grounding device is configured to establish electric connection with at least some of the guide elements when it is in the extended position. The grounding system of the present invention has the advantage of being reliable, safe and economic.

The guide elements or at least the surface of said guide elements are made of an electrically conductive material.

There may be more than one extendable grounding device installed per valve. The shield structure may protect a bottom surface and four lateral surfaces of the valve, which may result in four extendable grounding systems per valve, one for each lateral side.

Alternatively it may be possible to electrically interconnect the whole shield structure and all its elements, so that a single grounding system per valve may be enough.

In an embodiment the extendable grounding device may be configured to be mounted such that it extends from the retracted position in a vertical downward direction into the extended position and retracts back from the extended position in a vertical upward direction into the retracted position. This may result in additional security in the rare case that power is completely cut or out. In such a case a drive or the like of the extendable grounding device may not work anymore and thus gravity can be used to put the extendable grounding device in position and thus ground the electric shield structure.

The extendable grounding device may be configured to be mounted in a ceiling of a structure. This simplifies mounting and installation since valves are usually also mounted suspending from the ceiling. Alternatively, the grounding system and the extendable grounding device may be configured to be connected to a carrying structure of the valve so that the valve may be installed as a package together with the grounding system.

Preferably at least some of the guide elements are funnel-shaped. This smooths the movement of the extendable grounding device during an extending operation from the retracted position into the extended position. Further it ensures that each portion or element of the electric shield structure is electrically connected via the guide elements to the extendable grounding system.

In an embodiment at least some of the guide elements are funnel-shaped in both ends, thus wider on a top and bottom than in the middle. This shape will smooth the movement of the extendable grounding device during a retracting or withdrawing operation from the extended position into the retracted position.

In an embodiment, the extendable grounding device may comprise a surge current limiting resistor at its free end. The free end of the extendable grounding device is the end opposite the ceiling of the structure, thus the end directed towards a floor of the structure, in case the HVDC valve arrangement is hanging.

Arranging the surge current limiting resistor at a free end of the extendable grounding system, ensures that the surge current limiting resistor is always the first element of the extendable grounding device that touches the guide elements and thus the electric shields of the electric shield structure.

This ensures that any residual capacitor energy is consumed by the resistor during the grounding process and sequence.

The extendable grounding device may comprise a low-resistive electric wire and a winch wherein the low-resistive electric wire is wound onto the winch, said winch being configured to move the low-resistive electric wire from the retracted position into the extended position and back.

Using a low-resistive electric wire in combination with a winch has the advantage that the winch can be easily remote controlled and that the electric wire has a very low electric resistance so that the path of any discharge current is given, since it will follow the way of easiest resistance and thus the low resistive electric wire.

Further the low-resistive electric wire is easy to handle and to guide by the guide elements.

The low-resistive electric wire may comprise the surge current limiting resistor at its free end.

The surge current limiting resistor ensures that an electric charge can be discharged. Preferably the surge current limiting resistor is arranged at the free end of the low-resistive electric wire.

The surge limiting resistor may be shaped so that it easily glides into and out of the guide elements.

Advantageously the winch may be connected to a drive, which is configured to allow remote control of the winch.

The drive may comprise a receiver and transmitter so that an operator can extend and withdraw the winch and thus the extendable grounding device from a remote location for example by using a remote control or another interface.

The high voltage valve unit may be a hanging semiconductor high voltage valve structure comprising at least two valve layers.

In an embodiment the electric shield structure may comprise a plurality of corona shields arranged around the valve layers of the high voltage valve unit.

Each corona shield is in electrical contact with at least one extendable grounding device when said grounding device is extended. In case the corona shields are not electrically interconnected with one another a plurality of extendable grounding systems may be used to ground all corona shields.

In an embodiment each valve layer may comprise exposed surfaces, whereby each corona shield may be assigned to one exposed surface and wherein guide elements are assigned to each corona shield such that the low-resistive electric wire is guided by the guide elements in a zig-zag pattern from guide element to guide element. The guide elements assigned to an electric shield may be guide element pairs.

Thus as seen in a vertical direction, the first set of guide elements assigned to a first valve layer may be slightly horizontally shifted in view of consecutive guide elements assigned to consecutive valve layers, such that the zig-zag pattern is achieved and established and such that each electric shield is grounded.

Instead of using funnel-shaped guide elements it may be possible to use magnetic elements that are configured to interact with the magnetic, low-resistive electric wire when it is extended. Such magnetic guide elements may get in physical and thus electrical contact with the low resistive electric wire, which may be designed to be magnetic.

Special magnetic contact portions may be installed on the low-resistive electric wire to ensure that the wire gets in contact with the magnetic guide elements.

Generally, all terms used in the claims are to be interpreted according to their ordinary meaning in the technical field, unless explicitly defined otherwise herein. All references to "a/an/the element, device, component, system, unit, portion, etc." are to be interpreted openly as referring to at least one instance of the element, device, component, system, unit, portion, etc., unless explicitly stated otherwise.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
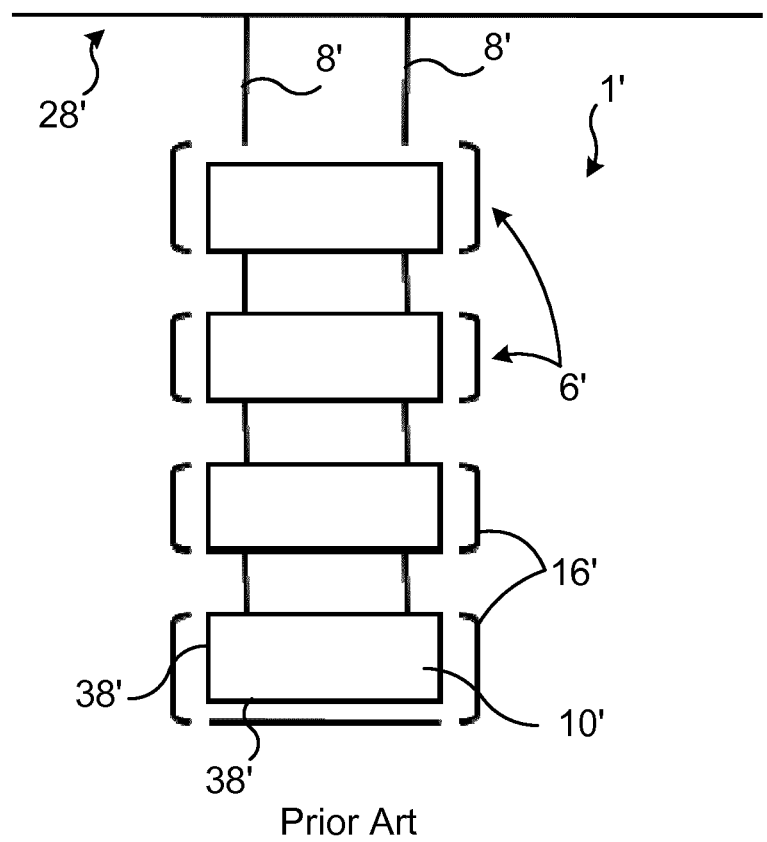
FIG. 1 schematically illustrates a side view of a hanging valve as it is known comprising electric shields.
Figure 2:
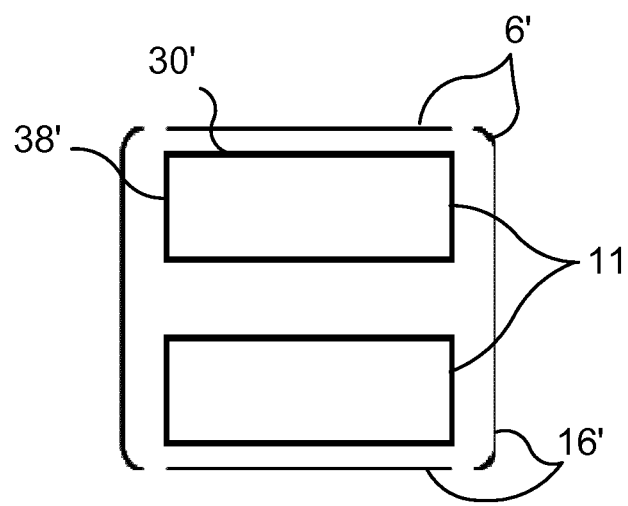
FIG. 2 illustrates the valve of FIG. 1 in a top down view.

Referring now to the figures, the invention is explained in more detail. FIGS. 1 and 2 illustrate a high voltage valve arrangement comprising a high voltage direct current (HVDC) valve unit 1', an external electric shield structure 6' and suspending insulators 8' that carry the HVDC valve unit 1'. The HVDC valve unit comprises a plurality of valve layers 10'.

In FIG. 1 the HVDC valve unit 1' is illustrated comprising four valve layers 10'. The valve layers 10' are installed hanging from a ceiling 28' of a structure and they are fixed to ceiling via suspending insulators 8'. Said suspending insulators 8' are also configured to interconnect the valve layers 10' in between one another.

The shield structure 6' comprises a plurality of electric shields 16' such as corona shields 16'. The electric shields 16' are arranged to cover exposed surfaces 38' of the valve layers 10' so that the electrical field strength is limited to acceptable levels. The HVDC valve unit 1' shown in FIGS. 1 and 2 comprises in total five sides with exposed surfaces 38', the four lateral sides and the one lower side which is facing away from the ceiling 28'.

Each side, thus each exposed surface, and each HVDC valve layer 10 may comprise an electric shield 16'. The electric shields 16' are not electrically or otherwise interconnected with one another. In the between the electric shields 16' there are gaps. A top side facing the ceiling 28' may also comprise an electric shield, even if this is not shown in the figures.

Figure 3:
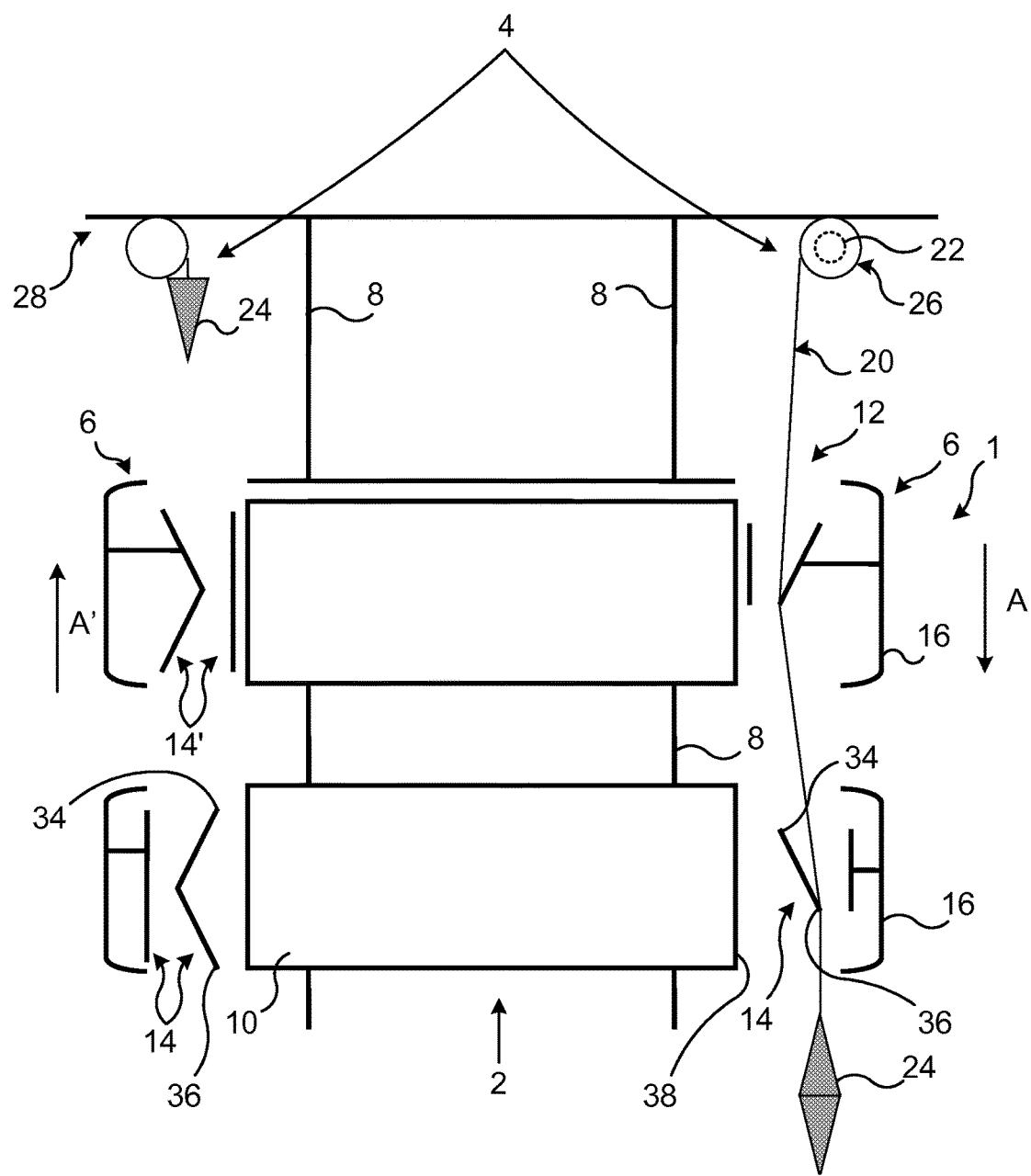
FIG. 3 schematically illustrates a high voltage semiconductor valve arrangement according to the invention comprising a grounding system.
Figure 4:
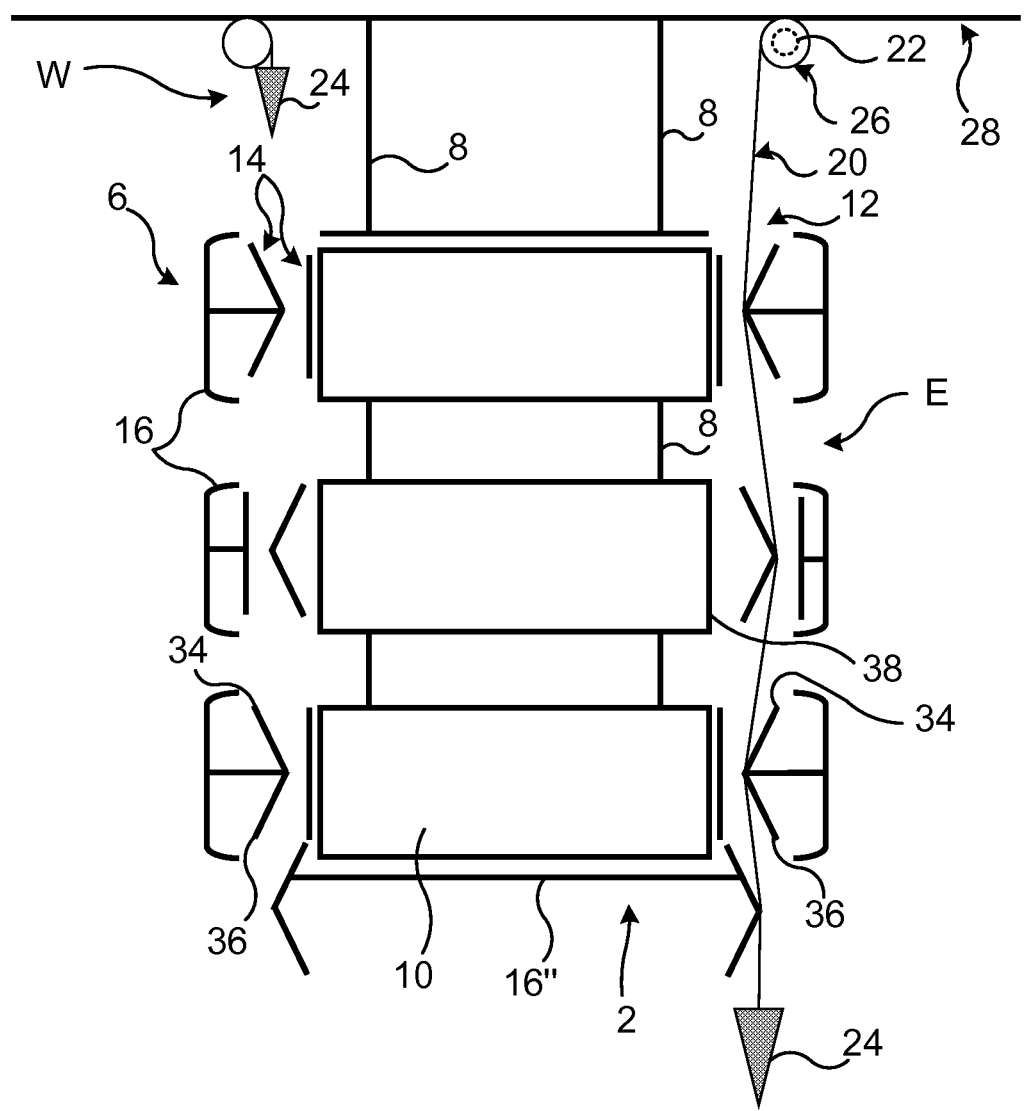
FIG. 4 schematically illustrates a similar embodiment as FIG. 3.

The valve layers 10' may comprise at least one, two or more valve modules ii as illustrated in FIG. 2. The valve modules or units 11 may be or may not be electrically interconnected in horizontal direction. Referring now to FIGS. 3 and 4, which show embodiments of the present invention, the high voltage direct current semiconductor valve arrangement 1 comprises a grounding system 4 that is configured to ground the electric shield structure 6 and thus the electric shields 16 or corona shields of the shield structure.

The grounding system 4 comprises an extendable grounding device 12 and guide elements 14 which are part of a guide arrangement. The extendable grounding device 12 comprises a low resistive electric wire 20, a winch 26 which is connected to a drive 22. The winch 26 is mounted on the ceiling 28 of the structure.

The drive 22 is configured to be remote controlled from a distance so that no personnel need to set foot into the valve hall before the corona shields are properly grounded. The drive 22 may be an electric drive 22 or the like that can be easily steered via a remote located computer or another remote interface. The low-resistive electric wire 20 may be connected via the winch 26 to a grounding interface in the ceiling 28. Remote control of the winch 26 means either by way of a wireless or a wired connection.

A guide element arrangement and the guide elements 14 are configured to be electrically connected to the electric shield structure 6. Each electric shield 16 or corona shield is electrically connected to a guide element 14. The guide elements 14 are made of an electrically conductive material or they are at least partially covered with an electrically conductive material. The guide elements 14 have a top 34 and bottom 36 as indicated in FIGS. 3 and 4.

The guide elements 14 may be funnel-shaped and they are configured to guide the extendable grounding device 12. This means that the surfaces of some lateral guide elements 14 are inclined at least on one side of a guide element pair. The guide element pair may comprise one inclined element and one vertical element as shown in FIGS. 3 and 4. However, it is within the scope of the invention to use guide element pairs that comprise two or more inclined surfaces to guide the extendable grounding device 12. Both guide elements 14 of a guide element pair are electrically connected to the corresponding electric shield 16.

The guide elements 14 may alternatively be double funnel shaped, open at the top 34 and bottom 36 as illustrated in FIG. 3 on the left side and in FIG. 4, so that low resistive electric wire 20 and the surge current limiting resistor 24 may be easily extended and retracted without congestion or blockage at the guide elements 14.

Each valve layer 10 has a plurality of electric shields 16 assigned to it, in the illustrated embodiment four electric shields 16 one on each lateral side of the square-shaped HVDC valve unit 2, besides the lowest valve layer 10, which in addition has an end-electric shield 16" assigned to it as shown in FIG. 4. The guide elements 14 assigned to the electric shields 16 of one of the valve layers 16 are slightly shifted in a horizontal direction in view of the guide elements 14 assigned to the electric shields of a consecutive valve layer 10, to ensure that the low resistive electric wire 20 establishes electric contact with each guide element 14 and thus with each electric shield 16 on its way to the extended position E. The low resistive electric wire 20 will follow a zig-zag pattern as a result of the horizontally shifted guide elements 14, as best illustrated in FIG. 4.

The winch 26 is configured to receive the low-resistive electric wire 20 so that it can be extended, thus uncoiled, from a retracted or withdrawn position W and retracted or withdrawn, thus wound up, from an extended position E, as illustrated in FIG. 4. The low-resistive electric wire 20 comprises a surge current limiting resistor 24 at its free end. The surge current limiting resistor 24 is configured to dissipate a potential surge current or any other spontaneous discharge. As illustrated in FIGS. 3 and 4, the surge current limiting resistor 24 is specifically shaped in order to facilitate the guidance of the low-resistive electric wire 20 by the guide elements 14. Preferably the surge current limiting resistor 24 is arrow-shaped or double arrow-shaped as indicated in FIGS. 3 and 4, it is however clear that any other shape that allows or facilitates the guidance by the guide elements may be used and falls within the scope of the invention.

The grounding system 4 as illustrated in the FIGS. 3 and 4 comprises four extendable grounding devices 12, each on one of the four lateral sides of the high voltage direct current semiconductor valve unit 2.

It falls within the scope of the invention to use only one extendable grounding device 12 for the high voltage direct current valve unit 2. In such an embodiment, the electric shields 16 of the electric shield structure should then however be electrically interconnected among each other.

The valve modules of the valve layers 10 and the HVDC valve unit may for example be mercury-arc valves, thyristor valves or transistors.

The valve layers 10 are connected to the ceiling by the suspending insulators 8, as described in view of FIGS. 1 and 2, however, the valve layers 10 may be connected and arranged within a valve carrying scaffolding (not shown) or the like. In such an embodiment the scaffolding may carry the electric shield structure 6 and thus the grounding system 4 as well.

The invention has now been described by indicating how the grounding system 4 interacts with the electric shield structure 6 and how the extendable grounding device 12 interacts with the guide elements 14. It is however possible to avoid the guide elements 14 in the grounding system 4 and position the electric shields 16 in view of the extendable grounding device 12 in a way such that the surge current limiting resistor 24 and its shape respectively establish electric contact with each electric shield 16 of one side of the HVDC valve unit 2, thus ensuring the low resistive electric wire 20 is in electric contact with each electric shield 16, 16" assigned to one lateral side and/or the lower side of the valve unit 2. The electric shields 16 may be positioned eccentrically to ensure that the low resistive electric wire 20 establishes contact with each electric shield 16 of one side of the valve unit 2 on its way from the retracted position W to the extended position E and when it is actually in the extended position E.

It is to be noted that instead of the surge current limiting resistor 24 an ordinary element made of an electrically conductive material may be used to guide the low resistive electric wire 20 and in order to provide some weight to straighten out the wire 20 and to ease the extending and retracting operation of the extendable grounding device 12 and low resistive electric wire 20, respectively.

The surge current limiting resistor 24 is arranged at a free end of the extendable grounding device 4. The surge current limiting resistor 24 is configured to be the first element or portion of the extendable grounding device that establishes electrical contact with guide elements 16 and thus with the electric shields 16, when the extendable grounding device 4 is moved from the retracted position W to the extended position E.

The extendable grounding device 12 has been described and illustrated by a winch 26, a drive 22 and an electric wire 20. It falls within the scope of the invention to use any other suitable extending device that may be used for grounding such as an extendable and retractable spring system, an extendable and retractable scaffolding structure or just an extendable and retractable telescopic arrangement that are configured to establish electric contact with the electric shields 16 assigned to one side of the valve unit 2 on their way from the retracted position W to the extended position E and in the extended position E.

The grounding system 4 only grounds the external electric shield structure 6 and not the HVDC valve unit 2 itself.

Instead of using a hanging high voltage valve arrangement 1 with suspending insulators 8, it is possible to install the high voltage valve arrangement 1 standing on a valve hall floor 30 of the structure or valve hall. In such an embodiment the extendable grounding device 4 may be a rigid extendable grounding device such as a scaffolding structure that may be extended or a telescopic extendable device that may be extended from the valve hall floor 30 towards the ceiling 28. Such a grounding device 4 also comprises a surge current limiting resistor at its free end to ensure that this resistor is the first element to establish electric contact with the guide elements 16.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A high voltage valve arrangement comprising:
a high voltage valve unit;
an external electric shield structure arranged at least partially around the high voltage valve unit;
a grounding system, the grounding system comprising an extendable grounding device on a lateral side of the high voltage valve unit and configured to be remotely extended in a vertical direction from a retracted position to an extended position, wherein the extendable grounding device establishes electric connection with the external shield structure when it is extended from the retracted position, and wherein the extendable grounding device is configured to be mounted in a ceiling of a structure; and
a plurality of guide elements, which are electrically connected to the electric shield structure, wherein the extendable grounding device is configured to establish electric connection with at least some of the guide elements when it is in the extended position.

2. The high voltage valve arrangement according to claim 1, wherein the extendable grounding device is configured to be mounted such that the extendable grounding device extends from the retracted position in a vertical downward direction into the extended position and withdraws back from the extended position in a vertical upward direction into the retracted position.

3. The high voltage valve arrangement according to claim 1, wherein at least some of the guide elements are funnel-shaped.

4. The high voltage valve arrangement according to claim 1, wherein at least some of the guide elements are funnel-shaped in both ends, thus being wider on a top and a bottom than in a middle.

5. The high voltage valve arrangement according to claim 1, wherein the extendable grounding device comprises a surge current limiting resistor arranged at its free end.

6. The high voltage valve arrangement according to claim 1, wherein the extendable grounding device comprises a low-resistive electric wire and a winch, and wherein the low-resistive electric wire is wound onto the winch, said winch being configured to move the low-resistive electric wire from the retracted position into the extend position and back.

7. The high voltage valve arrangement according to claim 1, wherein the extendable grounding device comprises a low-resistive electric wire, and the low-resistive electric wire comprises a surge current limiting resistor at its free end.

8. The high voltage valve arrangement according to claim 6, wherein the winch is connected to a drive, which is configured to allow remote control of the winch.

9. The high voltage valve arrangement according to claim 1, wherein the high voltage valve unit is a hanging semiconductor high voltage valve structure comprising at least two valve layers.

10. The high voltage valve arrangement according to claim 1, wherein the high voltage valve unit comprises at least two valve layers, and the electric shield structure comprises a plurality of corona shields arranged around the at least two valve layers of the high voltage valve unit.

11. The high voltage valve arrangement according to claim 10, wherein each of the at least two valve layers comprises exposed surfaces, each of the plurality of corona shields being assigned to one exposed surface, and wherein the extendable grounding device comprises a low-resistive electric wire, and guide elements are assigned to each corona shield such that the low-resistive electric wire is guided by the guide elements in a zig-zag pattern from guide element to consecutive guide element.

12. The high voltage valve arrangement according to claim 2, wherein at least some of the guide elements are funnel-shaped.

13. The high voltage valve arrangement according to claim 2, wherein at least some of the guide elements are funnel-shaped in both ends, thus being wider on a top and a bottom than in a middle.

14. The high voltage valve arrangement according to claim 3, wherein at least some of the guide elements are funnel-shaped in both ends, thus being wider on a top and a bottom than in a middle.

15. The high voltage valve arrangement according to claim 2, wherein the extendable grounding device comprises a surge current limiting resistor arranged at its free end.

16. The high voltage valve arrangement according to claim 3, wherein the extendable grounding device comprises a surge current limiting resistor arranged at its free end.

17. The high voltage valve arrangement according to claim 4, wherein the extendable grounding device comprises a surge current limiting resistor arranged at its free end.

18. The high voltage valve arrangement according to claim 2, wherein the extendable grounding device comprises a low-resistive electric wire and a winch, and wherein the low-resistive electric wire is wound onto the winch, said winch being configured to move the low-resistive electric wire from the retracted position into the extend position and back.

19. The high voltage valve arrangement according to claim 3, wherein the extendable grounding device comprises a low-resistive electric wire and a winch, and wherein the low-resistive electric wire is wound onto the winch, said winch being configured to move the low-resistive electric wire from the retracted position into the extend position and back.

20. The high voltage valve arrangement according to claim 4, wherein the extendable grounding device comprises a low-resistive electric wire and a winch, and wherein the low-resistive electric wire is wound onto the winch, said winch being configured to move the low-resistive electric wire from the retracted position into the extend position and back.

* * * * *